US012355429B2

(12) United States Patent
Zlotnik et al.

(10) Patent No.: US 12,355,429 B2
(45) Date of Patent: Jul. 8, 2025

(54) DIGITAL SWITCHING ACTIVITY SENSING

(71) Applicant: Micron Technology, Inc., Boise, ID (US)

(72) Inventors: Leon Zlotnik, Camino, CA (US); Leonid Minz, Beer Sheva (IL); Pranjal Chauhan, Fatehpur (IN)

(73) Assignee: Micron Technology, Inc., Boise, ID (US)

( * ) Notice: Subject to any disclaimer, the term of this patent is extended or adjusted under 35 U.S.C. 154(b) by 319 days.

(21) Appl. No.: 17/966,300

(22) Filed: Oct. 14, 2022

(65) Prior Publication Data

US 2023/0283386 A1 Sep. 7, 2023

(30) Foreign Application Priority Data

Mar. 3, 2022 (IN) .............................. 202241011523

(51) Int. Cl.
*H03K 17/00* (2006.01)
*G06F 9/38* (2018.01)
*H03K 19/00* (2006.01)
*G11C 7/22* (2006.01)

(52) U.S. Cl.
CPC ........... *H03K 17/00* (2013.01); *G06F 9/3869* (2013.01); *H03K 19/00* (2013.01); *G11C 7/22* (2013.01)

(58) Field of Classification Search
CPC ........ H03K 17/00; H03K 19/00; H04B 15/02; G06F 9/3869; G11C 7/22; G11C 5/14
See application file for complete search history.

(56) References Cited

U.S. PATENT DOCUMENTS

| | | | |
|---|---|---|---|
| 3,430,070 A | 2/1969 | Marshall, Jr. et al. | |
| 5,179,295 A | 1/1993 | Mattison et al. | |
| 5,767,717 A | 6/1998 | Schorn et al. | |
| 6,844,767 B2 * | 1/2005 | Shelor | G06F 1/10 |
| | | | 327/295 |
| 9,599,672 B2 | 3/2017 | Abhishek et al. | |
| 9,928,323 B2 * | 3/2018 | Wilson | G06F 30/33 |
| 9,984,187 B1 * | 5/2018 | Sultania | G06F 30/343 |
| 10,296,686 B1 * | 5/2019 | Krishnamurthy | G06F 30/327 |
| 2006/0248354 A1 * | 11/2006 | Pineda De Gyvez | ....................... |
| | | | H03K 19/0016 |
| | | | 713/300 |
| 2006/0294282 A1 | 12/2006 | Warner | |

(Continued)

FOREIGN PATENT DOCUMENTS

| | | | | |
|---|---|---|---|---|
| CN | 110114768 A | * | 8/2019 | ......... G06F 17/5027 |
| EP | 4293912 A1 | * | 12/2023 | ............ H03M 1/002 |
| WO | WO-2020151846 A1 | * | 7/2020 | ............. G01R 22/10 |

*Primary Examiner* — Seokjin Kim
(74) *Attorney, Agent, or Firm* — Brooks, Cameron & Huebsch, PLLC

(57) ABSTRACT

Clock enable signals are collected and summed. The number of simultaneously enabled clock enable signals can represent switching activity within a system and can be used as an indicator for power management, noise management, etc. of such a system. Digital switching activity sensing include performance of an operation to sum a quantity of open clock gates associated with a plurality of latches that are grouped into multiple subsets of latches. An activity indication is generated based, at least in part, on a result of the operation to sum the quantity of open clock gates associated with the plurality of latches.

23 Claims, 4 Drawing Sheets

(56) References Cited

U.S. PATENT DOCUMENTS

| | | | | |
|---|---|---|---|---|
| 2015/0220128 A1* | 8/2015 | Barrenscheen | ....... | G06F 1/3296 |
| | | | | 713/322 |
| 2020/0073433 A1* | 3/2020 | Aune | ................ | G06F 30/3308 |
| 2023/0327444 A1* | 10/2023 | Zlotnik | .................. | H02J 3/02 |
| | | | | 700/205 |
| 2024/0213987 A1* | 6/2024 | Dai | ....................... | H03K 19/20 |

* cited by examiner

US 12,355,429 B2

DIGITAL SWITCHING ACTIVITY SENSING

PRIORITY INFORMATION

This application claims the benefit of India Provisional Application No. 202241011523, filed on Mar. 3, 2022, then contents of which are incorporated herein by reference.

TECHNICAL FIELD

Embodiments of the disclosure relate generally to digital logic circuits, and more specifically, relate to digital switching activity sensing

BACKGROUND

A memory system can include one or more digital circuits that can include various clocking circuitry and various latching circuitry. In general, the latching circuitry receives a clocking signal from the clocking circuitry as part of operating of the latching circuitry.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
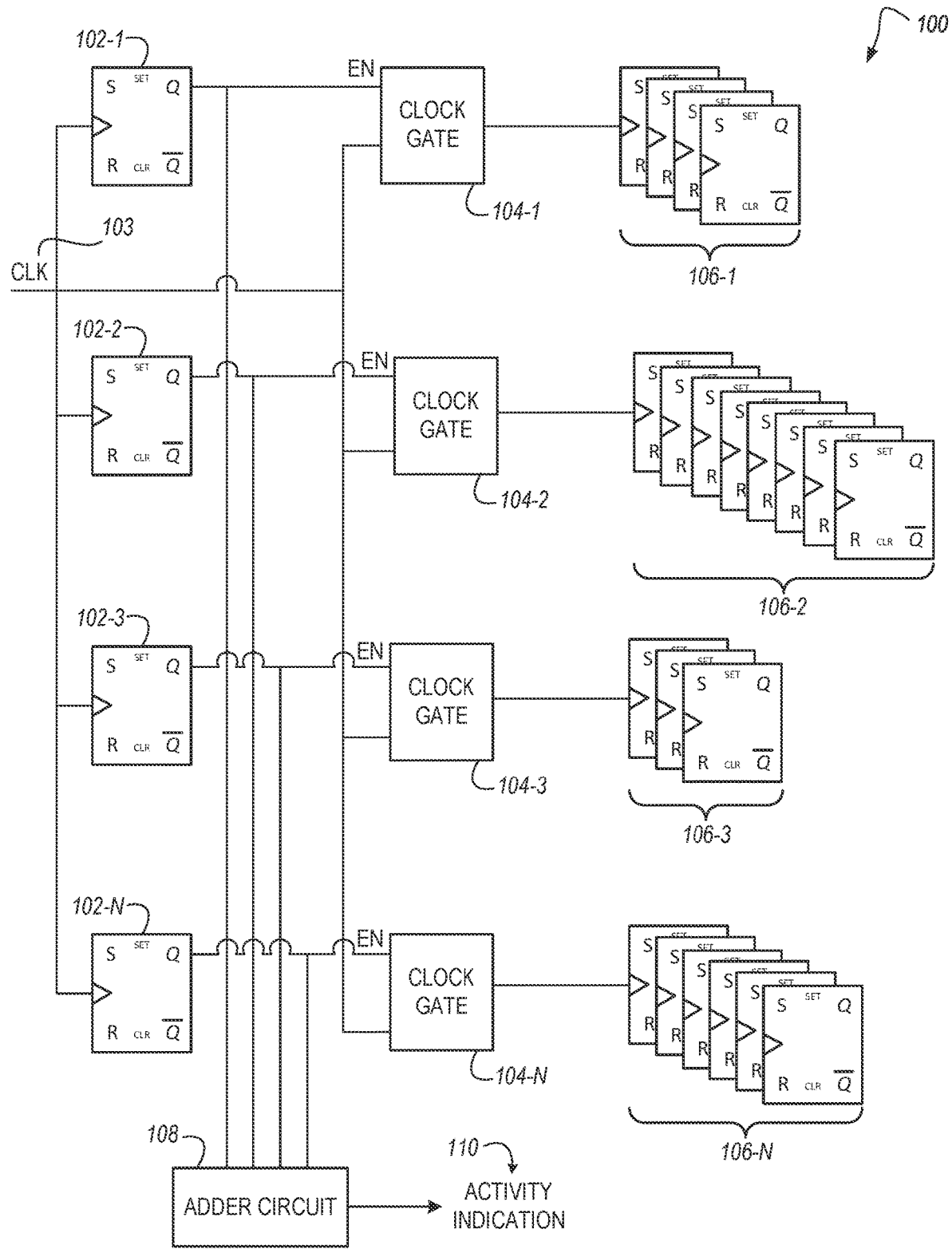
FIG. 1 illustrates an example system for digital switching activity sensing in accordance with some embodiments of the present disclosure.

Aspects of the present disclosure are directed to digital switching activity sensing. Digital switching activity sensing can be achieved through the use of various circuitries (e.g., clocking circuitry, adder circuits, and/or latching circuitry, etc.). Digital switching activity sensing can be performed by receiving information from such circuitries and can generate information corresponding to power consumption and/or noise generation, among other factors or parameters for a system in which digital switching activity sensing is deployed. Accordingly, digital switching activity sensing can provide benefits in systems (e.g., application-specific integrated circuits (ASICs), field-programmable gate arrays (FPGAs), automated power management systems, etc.) that rely on instantaneous (or near-instantaneous) current sensing to track, limit, adjust, and/or manipulate power consumption and/or noise dynamically. Examples of digital switching activity sensing and the circuitries that can be utilized to facilitate embodiments of the present disclosure are described below in conjunction with FIG. 1, et alibi.

As described in more detail herein, aspects of the present disclosure allow for clock gate signals (e.g., fine grain clock gate signals) to be collected and summed to determine a quantity of open (e.g., activated or "enabled") clock gate signals at any given time (e.g., at any given rising or falling clock edge). Because the quantity of open clock gate signals can correspond to respective different groups of latches or flip-flops that can include varying quantities of latches or flip-flops, the switching activity associated with the open clock gates can correspond to activity within a particular partition (e.g., portion) of, or an entire core of, for example, an application-specific integrated circuit (ASIC). Accordingly, the quantity of open clock gate signals can be utilized as an indication of the switching activity of the system and, hence, power consumption, current flow, and/or noise associated with the system. As described in more detail herein, such indications can be processed to generate an activity indication that can be used to instantaneously (or near-instantaneously) provide current sensing to track, limit, adjust, and/or manipulate power consumption and/or noise dynamically.

In general, clocking circuitry (e.g., fine grain clock gates) are generally utilized during logic synthesis (e.g., during ASIC logic synthesis) for a system (e.g., a system of digital logic components and/or circuits) in which hardware description language (HDL) is transformed into a netlist describing the hardware (e.g., the latches, flip-flops, logic gates, connecting wires, etc.) of the systems described herein. As used herein, the term "netlist" generally refers to a description of the connectivity of an electronic circuit. For example, a netlist can be a list of the electronic components in a circuit and a list of the nodes they are connected to in the systems described herein.

Embodiments are not limited to utilization of fine grain clock gates during logic synthesis, however. For example, it is also possible to perform fine grain clock enable logic in register transfer logic (RTL) code; however, it is generally more efficient to insert digital logic corresponding to the fine grain clock gates during synthesis or as an engineering change order (ECO) by inserting a logic change directly into the netlist after it has already been processed by an automatic tool or automated testing equipment (e.g., without re-performing full ASIC logic synthesis).

As described in more detail herein, aspects of the present disclosure allow for an activity weight to be assigned to one or more fine grain clock gates based on a quantity of latches (e.g., edge-triggered latches, level-sensitive latches, etc.) or flip-flops associated with each of the fine grain clock gates. The activity weight can be assigned during full ASIC logic synthesis and/or during synthesis performed as part of an ECO. The activity weight can correspond to an "activity indication" and can be used to instantaneously (or near-instantaneously) provide current sensing to track, limit, adjust, and/or manipulate power consumption and/or noise dynamically in a system or circuit, such as an ASIC, an FPGA, or other suitable circuitry that utilizes digital logic components. These and other aspects of the present disclosure can provide for a reduction in power consumption in various types of systems, computing devices, and/or circuits; thereby providing an improvement to computing devices in which aspects of the present disclosure are deployed.

FIG. 1 illustrates an example system 100 for digital switching activity sensing in accordance with some embodiments of the present disclosure. The example system 100, which can be referred to in the alternative as an "apparatus 100," includes latches 102-1, 102-2, 102-3, to 102-N, which are referred to in the alternative as "flip-flops" 102-1, 102-2, 102-3, to 102-N (which are generally referred to as the "latches 102-1 to 102-N" or "flip-flops 102-1 to 102-N,"

herein). As shown in FIG. 1, the system 100 further includes clock gates 104-1, 104-2, 104-3, to 104-N (which are generally referred to as "clock gates 104-1 to 104-N," herein). The clock gates 104-1 to 104-N can receive a clock signal "CLK 103" from circuitry external to the system 100 illustrated in FIG. 1.

As shown in FIG. 1, The clock gates 104-1 to 104-N are coupled to respective groups of latches (or flip-flops) 106-1, 106-2, 106-3, to 106-N (which are generally referred to as "groups of latches 106-1 to 106-N," or "groups of flip-flops 106-1 to 106-N," herein). In general, the "latches" referred to herein are edge-triggered latches (e.g., latches that are triggered in response to a rising or falling edge of a clocking signal) or level-sensitive latches (e.g., latches that are transparent for a particular clock signal level and opaque for a different clock signal level).

The clock gates 104-1 to 104-N are further coupled to an adder circuit 108 that can be configured to perform operations that can cause generation of an activity indication 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The components of the system 100, such as the latches/flip-flops 102-1 to 102-N, the clock gates 104-1 to 104-N, the latches/flip-flops 106-1 to 106-N, and/or the adder circuit 108 can individually or collectively be referred to herein as a "system" or an "apparatus," given the context of the disclosure. Accordingly, one or more components of the system 100 (e.g., the latches/flip-flops 102-1 to 102-N, the clock gates 104-1 to 104-N, the latches/flip-flops 106-1 to 106-N, and/or the adder circuit 108) can be provided on a single chip and/or a portion thereof. Similarly, one or more components of the system 100 (e.g., the latches/flip-flops 102-1 to 102-N, the clock gates 104-1 to 104-N, the latches/flip-flops 106-1 to 106-N, and/or the adder circuit 108) can be provided on multiple chips and/or portions thereof.

The system 100 can include at least a portion of a system-on-chip (SoC), such as an application-specific integrated circuit (ASIC), field-programmable gate array (FPGA), etc. For example, the latches/flip-flops 102-1 to 102-N, the clock gates 104-1 to 104-N, the latches/flip-flops 106-1 to 106-N, and/or the adder circuit 108 can be resident on a SoC, such as an ASIC, FPGA, or the like. As used herein, the term "resident on" refers to something that is physically located on a particular component. For example, the latches/flip-flops 102-1 to 102-N, the clock gates 104-1 to 104-N, the latches/flip-flops 106-1 to 106-N, and/or the adder circuit 108 being "resident on" the system 100 (e.g., an ASIC, FPGA, etc.) refers to a condition in which the hardware circuitry that comprises the latches/flip-flops 102-1 to 102-N, the clock gates 104-1 to 104-N, the latches/flip-flops 106-1 to 106-N, and/or the adder circuit 108 is physically located on the system 100. The term "resident on" may be used interchangeably with other terms such as "deployed on" or "located on," herein.

In some embodiments, a clock signal (i.e., the CLK 103) is asserted to the clock gates 104-1 to 104-N. As mentioned above, the clock gates 104-1 to 104-N can be fine grain clock gates (e.g., the clock gates 104-1 to 104-N can correspond to clock gating logic that is encoded in the RTL code as enable conditions that can be automatically translated into clock gating logic by the synthesis processes described above. The CLK 103 can be asserted to multiple the clock gates 104-1 to 104-N (e.g., to multiple clock nodes or "clock leaves") concurrently. Accordingly, in some embodiments, each of the clock gates 104-1 to 104-N can be initiated concurrently based on the CLK 103 signal and/or can be subjected to a same clock domain.

In some embodiments, the clock gates 104-1 to 104-N are "open" or "enabled" (as indicated by the "EN" indication) at least partially in response to receipt of signaling from the latches 102-1 to 102-N as shown in FIG. 1. For example, the clock gates 104-1 to 104-N can receive, in addition to the CLK 103 signal, signaling from respective latches 102-1 to 102-N as part of enabling clocking operations performed by the clock gates 104-1 to 104-N.

As described herein, the number of "leaf" groups of latches 106-1 to 106-N can be determined by tracing the "clock leaf" signals associated with the clock gates 104-1 to 104-N. For example, the group of latches 106-2 contains eight latches, which can be determined by the system 100 by tracing the quantity of clock leaves associated with the clock gate 104-2. Since the number of latches per group of latches 106-1 to 106-N per clock gate 104-1 to 104-N can vary in practice, the "activity weight" (e.g., the quantity of open or active clock gates 104-1 to 104-N per quantity of latches associated with each group of latches 106-1 to 106-N corresponding to each of the clock gates 104-1 to 104-N) of each of the clock gates 104-1 to 104-N generally varies accordingly.

In order to address these variances for purposes of the digital switching activity sensing described herein, embodiments allow for each of the clock gates 104-1 to 104-N to be assigned to a particular group of latches 106-1 to 106-N and to estimate a quantity of latches within each of the groups of latches 106-1 to 106-N associated with each of the clock gates 104-1 to 104-N. For example, a first grouping of latches among the groups of latches 106-1 to 106-N that include between three and four latches (e.g., the group of latches 106-1 and the group of latches 106-3) can be associated and weighted together, while a second grouping of latches among the groups of latches 106-1 to 106-N that include between five and four eight (e.g., the group of latches 106-2 and the group of latches 106-N) can be associated and weighted together, as described in more detail in connection with FIG. 2, herein. Although illustrated and discussed for illustrative purposes of a grouping that contain between three and four latches and a grouping that contains between five and eight latches, embodiments are not so limited and other numerical values of grouping latches (e.g., one to two latches, eight to sixteen latches, twenty-four to thirty-six latches, etc.) are contemplated within the scope of the disclosure.

That is, embodiments of the present disclosure can simplify assignment of groups of latches 106-1 to 106-N based on the clock gates 104-1 to 104-N in contrast to previous approaches. This can allow for instantaneous (or near instantaneous) determination of activity present in the system 100 to allow for current sensing in the system 100 that can be used to track, limit, adjust, and/or manipulate power consumption and/or noise dynamically, as opposed to slower reactive and/or inaccurate paradigms that are generally employed in previous approaches and/or native byte, word or double word data path paradigms employed in previous approaches.

As shown in FIG. 1, the clock gates 104-1 to 104-N are coupled to an adder circuit 108. As used herein, the term "adder circuit" generally refers to a digital circuit that performs addition of numbers (e.g., bit strings, binary numbers, integer numbers, etc.). In some embodiments, the adder circuitry 108 can perform an addition operation to sum the quantity of open clock gates 104-1 to 104-N and/or the quantity of latches 106-1 to 1-6-N associated with each of the open clock gates 104-1 to 104-N. The result of such an addition operation can be used to generate an activity indication 110, which, as described above, can be used to instantaneously (or near-instantaneously) provide current sensing to track, limit, adjust, and/or manipulate power consumption and/or noise dynamically for the system 100 and/or components externally coupled to the system 100, such as the power management circuitry 318 illustrated in FIG. 3, herein.

Figure 2:
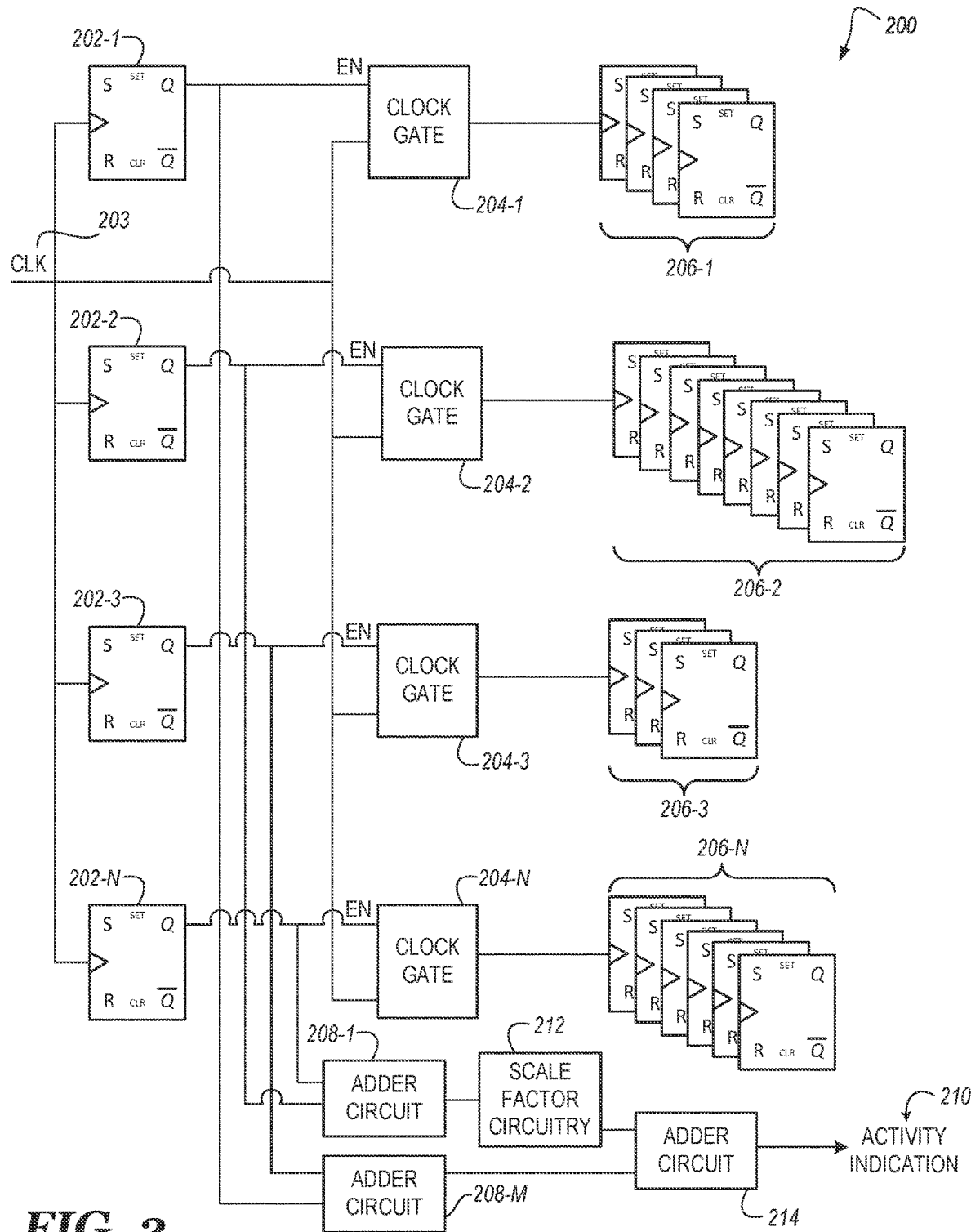
FIG. 2 illustrates another example system for digital switching activity sensing in accordance with some embodiments of the present disclosure.

In a non-limiting example, an apparatus (e.g., the system 100) includes circuitry (e.g., the adder circuitry 108 and/or the adder circuitry 208-1 to 208-M illustrated in FIG. 2, herein). The circuitry is configured to perform an operation to sum a quantity of open clock gates 104-1 to 104-N associated with a plurality of latches (e.g., edge-triggered latches, level-sensitive latches, etc.) that are grouped into multiple groups of latches 106-1 to 106-N. So as not to obfuscate the drawings, the latches of FIG. 1 are not independently labeled, but instead are shown as groups of latches 106-1 to 106-N. However, it is noted that the plurality of latches associated with respective groups of latches 106-1 to 106-N may referred to herein independently of the groups of latches 106-1 to 106-N in which such latches are included.

The circuitry can generate an activity indication 110 based, at least in part, on a result of the operation to sum the quantity of open clock gates 104-1 to 104-N associated with the plurality of latches. Continuing with this non-limiting example, latches from at least two groups of the latches 106-1 to 106-N are used in the operation to sum the quantity of open clock gates 104-1 to 104-N associated with the plurality of latches. In some embodiments, the circuitry can cause the activity indication 110 to be transferred to power management circuitry (e.g., the power management circuitry 318 illustrated in FIG. 3, herein) as part of performance of a power management operation. As described herein, the power management operation can be an operation to provide current sensing in the system 100 to track, limit, adjust, and/or to manipulate power consumption and/or noise in the system 100 and/or systems coupled thereto dynamically.

Continuing with this non-limiting example, the open clock gates 104-1 to 104-N can be fine grain clock gates. As described above, fine grain clock gates can be exhibited by clock gating logic that is coded into the RTL as enable conditions that can be automatically translated into clock gating logic by synthesis tools.

In some embodiments, the apparatus further includes scale factor circuitry (e.g., the scale factor circuitry 212 illustrated in FIG. 2, herein). The scale factor circuitry can be configured to apply a scale factor to the result of the operation to sum the quantity of open clock gates 104-1 to 104-N associated with the plurality of latches, as described in more detail in connection with FIG. 2.

The circuitry can include a first adder circuit (e.g., the adder circuit 208-1 illustrated in FIG. 2, herein) to perform an operation to sum a quantity of open clock gates 104-1 to 104-N associated with a first group of the latches (e.g., the group of latches 206-2 and/or the group of latches 206-N illustrated in FIG. 2, herein). Continuing with this non-limiting example, the circuitry can further include a second adder circuit (e.g., the adder circuit 208-M illustrated in FIG. 2, herein) to perform an operation to sum a quantity of open clock gates 104-1 to 104-N associated with a second group of the latches (e.g., the group of latches 206-1 and/or the group of latches 206-3 illustrated in FIG. 2, herein). The circuitry can further include a third adder circuit (e.g., the adder circuit 214 illustrated in FIG. 2, herein) to perform an operation to sum the quantity of open clock gates 104-1 to 104-N associated with the first group of the latches and the quantity of open clock gates 104-1 to 104-N associated with the second group of the latches.

In some embodiments, the system 100 can be deployed on, or otherwise included in a memory system (e.g., a storage device, a memory module, or a hybrid of a storage device and memory module). Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

In other embodiments, the system 100 can be deployed on, or otherwise included in a computing device such as a desktop computer, laptop computer, server, network server, mobile computing device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

Such computing devices can include a host system that is coupled to a memory system (e.g., one or more storage devices, memory modules, or a hybrid of a storage device and memory module). A host system can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system uses the storage device, the memory module, or a hybrid of the storage device and the memory module, for example, to write data to the storage device, the memory module, or the hybrid of a storage device and memory module and read data from the storage device, the memory module, or the hybrid of a storage device and memory module.

In these examples, the host system can include a processing unit such as a central processing unit (CPU) that is configured to execute an operating system. In some embodiments, the processing unit can execute a complex instruction set computer architecture, such an x86 or other architecture suitable for use as a CPU for a host system.

A host system can be coupled to a memory system via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system and the memory system. The host system can further utilize an NVM Express (NVMe) interface to access components when the memory system is coupled with the host system by the PCIe interface. The physical host interface can provide an interface for passing control, address, data, and other signals between the memory system and the host system. In general, the host system can access multiple memory sub-systems via a same communication connection, multiple separate communication connections, and/or a combination of communication connections.

A memory system can include any combination of the different types of non-volatile memory devices and/or volatile memory devices. The volatile memory devices can be, but are not limited to, random access memory (RAM), such as dynamic random-access memory (DRAM) and synchronous dynamic random access memory (SDRAM).

Some examples of non-volatile memory devices include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory components such as three-dimensional cross-point arrays of non-volatile memory cells and NAND type memory (e.g., 2D NAND, 3D NAND) are described, the memory device can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory system can also include additional circuitry or components. In some embodiments, a memory system can include a cache or buffer (e.g., DRAM) and address circuitry (e.g., a row decoder and a column decoder) that can receive an address from the memory system controller and decode the address to access the memory device(s).

In some embodiments, memory devices can include local media controllers that operate in conjunction with a memory system controller to execute operations on one or more memory cells of the memory devices. For example, an external controller can externally manage the memory device (e.g., perform media management operations on the memory device). In some embodiments, a memory device is a managed memory device, which is a raw memory device combined with a local controller for media management within the same memory device package. An example of a managed memory device is a managed NAND (MNAND) device.

FIG. 2 illustrates another example system 200 for digital switching activity sensing in accordance with some embodiments of the present disclosure. The system 200 can be analogous to the system 100 illustrated in FIG. 1. The example system 200, which can be referred to in the alternative as an "apparatus 200," includes flip-flops 202-1, 202-2, 202-3, to 202-N, which can be analogous to the latches or flip-flops 102-1 to 102-N illustrated in FIG. 1. As shown in FIG. 2, the system 200 further includes clock gates 204-1, 204-2, 204-3, to 204-N (which are generally referred to as "clock gates 204-1 to 204-N," herein), and which can be analogous to the clock gates 104-1 to 104-N illustrated in FIG. 1. The clock gates 204-1 to 204-N can receive a clock signal "CLK 203" from circuitry external to the system 200 illustrated in FIG. 2.

The components of the system 200, such as the latches/flip-flops 202-1 to 202-N, the clock gates 204-1 to 204-N, the latches/flip-flops 206-1 to 206-N, the adder circuits 208-1 to 208-N, the scale factor circuitry 212, and/or the adder circuit 214 can individually or collectively be referred to herein as a "system" or an "apparatus," given the context of the disclosure. Accordingly, one or more components of the system 200 (e.g., the latches/flip-flops 202-1 to 202-N, the clock gates 204-1 to 204-N, the latches/flip-flops 206-1 to 206-N, the adder circuits 208-1 to 208-N, the scale factor circuitry 212, and/or the adder circuit 214) can be provided on a single chip and/or a portion thereof. Similarly, one or more components of the system 200 (e.g., the latches/flip-flops 202-1 to 202-N, the clock gates 204-1 to 204-N, the latches/flip-flops 206-1 to 206-N, the adder circuits 208-1 to 208-N, the scale factor circuitry 212, and/or the adder circuit 214) can be provided on multiple chips and/or portions thereof.

As described above in connection with FIG. 1, The system 200 can include at least a portion of a system-on-chip (SoC), such as an application-specific integrated circuit (ASIC), field-programmable gate array (FPGA), etc. For example, the latches/flip-flops 202-1 to 202-N, the clock gates 204-1 to 204-N, the latches/flip-flops 206-1 to 206-N, the adder circuits 208-1 to 208-N, the scale factor circuitry 212, and/or the adder circuit 214 can be resident on a SoC, such as an ASIC, FPGA, or the like.

As shown in FIG. 2, The clock gates 204-1 to 204-N are coupled to respective groups of flip-flops 206-1, 206-2, 206-3, to 206-N (which are generally referred to as "groups of flip-flops 206-1 to 206-N," herein), and which can be analogous to the groups of latches and/or the groups of flip-flops 106-1 to 106-N illustrated in FIG. 1. The groups of flips-flops 206-1 to 206-N can, in some embodiments, be treated the same for purposes of generating the activity indication 210 if they have a sufficiently corresponding quantity of flip-flops associated therewith.

For example, the group of flip-flops 206-1 includes four flip-flops while the group of flip-flops 206-3 includes three flip-flops. However, in order to simplify the operations described herein and to expedite calculation of the activity indicator 210, the group of flip-flops 206-1 and the groups of flip-flops 206-3 can be treated as having a same quantity of flip-flops for purposes determining simultaneously clocked flip-flops and can therefore be associated with a same adder circuit (e.g., the adder circuit 208-M). Similarly, the group of flip-flops 206-2 includes eight flip-flops while the group of flip-flops 206-N includes six flip-flops. However, in order to simplify the operations described herein and to expedite calculation of the activity indicator 210, the group of flip-flops 206-2 and the groups of flip-flops 206-N can be treated as having a same quantity of flip-flops for purposes determining simultaneously clocked flip-flops and can therefore be associated with a same adder circuit (e.g., the adder circuit 208-1).

The clock gates 204-1 to 204-N are further coupled to an adder circuit 208-1 and an adder circuit 208-M, which can be analogous to the adder circuit 108 illustrated in FIG. 1. The adder circuit 208-1 can be coupled to scale factor circuitry 212, which is in turn coupled to an adder circuit 214, while the adder circuit 208-M can be coupled directly to the adder circuit 214. The adder circuit 214 can be configured to generate an activity indication 210, which can be analogous to the activity indication 110 illustrated in FIG. 1.

In some embodiments, the adder circuit 208-1 and the adder circuit 208-M can sum a quantity of open clock gates 204-1 to 204-N that are simultaneously open on a per-group basis (e.g., per each of the groups of flip-flops 206-1 to 206-N). As shown in FIG. 2, counts for higher weight adder circuit inputs (e.g., the group of flip-flops 206-2 and the group of flip-flops 206-N) can be normalized by applying a scale factor using the scale factor circuitry 212. In such embodiments, the adder circuit 214 then performs an operation to sum normalized and non-normalized counts collected from the adder circuit 208-1 and the adder circuit 208-M to generate a result that corresponds to the quantity of simultaneously clocked flip-flops. This information can in turn be used to generate the activity indication 210.

The group assignment (e.g., the assignment of flip-flops into the groups 206-1 to 206-N that are coupled to respective clock gates 204-1 to 204-N) illustrated in FIG. 2 can simplify performance of a normalization operation (e.g., an operation to apply the scale factor using the scale factor circuitry 212 to normalize counts collected from the adder circuit 208-1 and the adder circuit 208-M) by utilizing multiplication factors of "2" (e.g., by multiplication by 2, 4, 8, etc.) in comparison to approaches that employ shift operations (e.g., "shift left" or "shift right" operations) where a scale factor may be a scale factor that is not a multiple of "2."

In a non-limiting example, an apparatus (e.g., the system 200) can include a first group of flip-flops 206-1/206-3 coupled to a first adder circuit 208-M, a second group of flip-flops 206-2/206-N coupled to a second adder circuit 208-1, and a third adder circuit 214 coupled to the first adder circuit 208-M and the second adder circuit 208-1. The first adder circuit 208-M can receive information corresponding to a quantity of open clock gates 204-1/204-3 associated with the first group of flip-flops 206-1/206-3 and perform an operation to sum the quantity of open clock gates 204-1/204-3 associated with the first group of flip-flops 206-1/206-3.

The second adder circuit 208-1 can receive information corresponding to a quantity of open clock gates 204-2/204-N associated with the second group of flip-flops 206-2/206-N and perform an operation to sum the quantity of open clock gates 204-2/204-N associated with the second group of flip-flops 206-2/206-N.

Continuing with this non-limiting example, the third adder circuit 214 can receive a result of the operation to sum the quantity of open clock gates 204-1/204-3 associated with the first group of flip-flops 206-1/206-3 and receive a result of the operation to sum the quantity of open clock gates 204-2/204-N associated with the second group of flip-flops 206-2/206-N. The third adder circuit 214 can perform an operation to sum the quantity of open clock gates 204-1/204-3 associated with the first group of flip-flops 206-1/206-3 and the quantity of open clock gates 204-2/204-N associated with the second group of flip-flops 206-2/206-N and generate an activity indication 210 based, at least in part, on the result of the operation to sum the quantity of open clock gates 204-1/204-3 associated with the first group of flip-flops 206-1/206-3 and the quantity of open clock gates 204-2/204-n associated with the second group of flip-flops 206-2/206-N. In some embodiments, the activity indication is used in performance of a power management operation, as described herein.

As described above, the operations performed by the first adder circuit 208-M, the second adder circuit 208-1, and the third adder circuit 214 are performed as part of a power management operation. For example, the apparatus can further include power management circuitry (e.g., the power management circuitry 318 illustrated in FIG. 3, herein) coupled to at least the third adder circuit 214 and the power management circuitry can receive the activity indication 210 and take an action to control an amount of voltage, and amount of current, or both, generated by the power management circuitry based on the activity indication.

In some embodiments, the apparatus further includes scale factor circuitry 212 coupled to the first adder circuit 208-M and/or the second adder circuit 208-1, and the third adder circuit 214. In such embodiments, the scale factor circuitry 212 is configured to apply a scale factor to a result of the operation to sum the quantity of open clock gates 204-1/204-3 associated with the first group of flip-flops 206-1/206-3 or a result of the operation to sum the quantity of open clock gates 204-2/204-N associated with the second group of flip-flops 206-1/206-N, or both. In some embodiments, the scale factor circuitry 214 is further configured to apply the scale factor to the result of the operation to sum the quantity of open clock gates 204-1/204-3 associated with the first group of flip-flops 206-1/206-3 or the result of the operation to sum the quantity of open clock gates 204-2/204-N associated with the second group of flip-flops 206-2/206-N based on which of the first group of flip-flops 206-1/206-3 and the second group of flip-flops 206-2/206-N contains a greater quantity of flip-flops.

In some embodiments, the first adder circuit 208-M and the second adder circuit 208-1 are configured to receive the information corresponding to the quantity of open clock gates 204-1/204-3 associated with the first group of flip-flops 206-1/206-3 and the information corresponding to the quantity of open clock gates 204-2/204-N associated with the second group of flip-flops 206-2/206-N concurrently. Embodiments are not so limited, however, and in some embodiments, the first adder circuit 208-M and the second adder circuit 208-1 are configured to receive the information corresponding to the quantity of open clock gates 204-1/204-3 associated with the first group of flip-flops 206-1/206-3 and the information corresponding to the quantity of open clock gates 204-2/204-N associated with the second group of flip-flops 206-2/206-N periodically based on a quantity of clock cycles that have elapsed since previous receipt of the information corresponding to the quantity of open clock gates 204-1/204-3 for the first group of flip-flops 206-1/206-3 and the information corresponding to the quantity of open clock gates 204-2/204-N for the second group of flip-flops 206-2/206-N.

Figure 3:
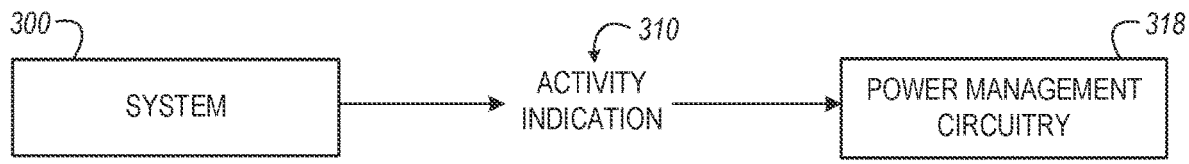
FIG. 3 illustrates an example system coupled to power management circuitry for digital switching activity sensing in accordance with some embodiments of the present disclosure.

FIG. 3 illustrates an example system 300 coupled to power management circuitry 318 for digital switching activity sensing in accordance with some embodiments of the present disclosure. The system 300 can be analogous to the system 100 illustrated in FIG. 1 and/or the system 200 illustrated in FIG. 2, herein. As shown in FIG. 3, the system generates an activity indication 310. The activity indication 310 can be analogous to the activity indication 110 illustrated in FIG. 1 and/or the activity indication 210 illustrated in FIG. 2, herein.

As shown in FIG. 3, the activity indication 310 can be transferred to power management circuitry 318. The power management circuitry 318 can be physically distinct from, but coupled to, the system 300. The power management circuitry can include various hardware components configured to perform a power management operation. In some embodiments, the power management operation can include decreasing and/or increasing a voltage, current, or other signaling parameter(s) based on the activity indication 310.

Figure 4:
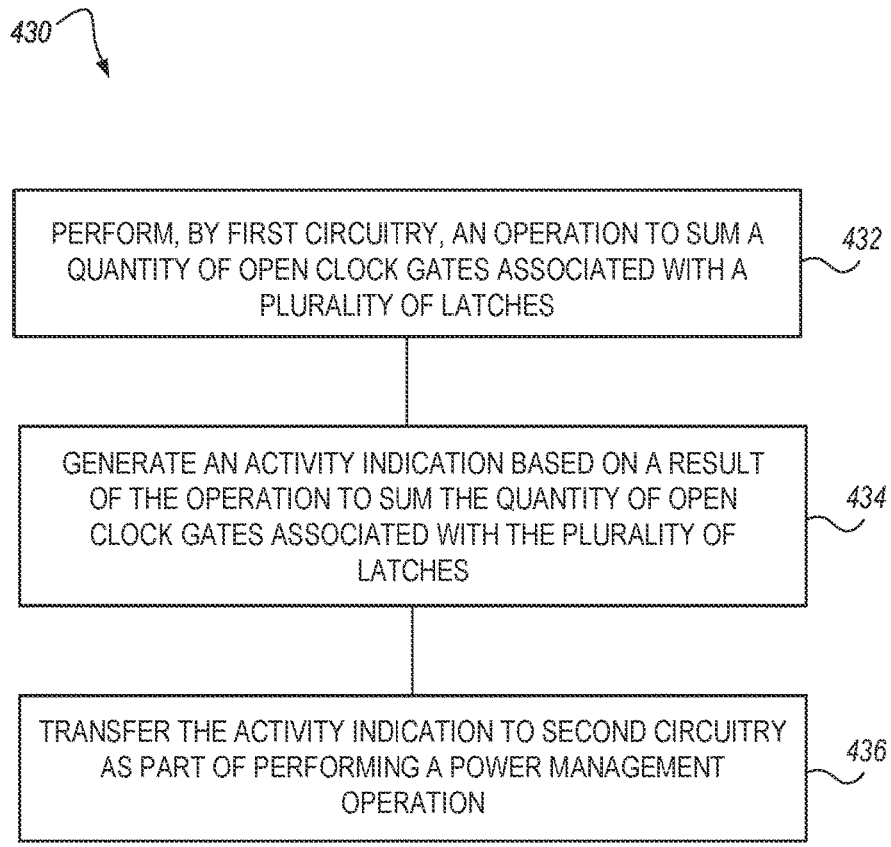
FIG. 4 is a flow diagram corresponding to a method for digital switching activity sensing in accordance with some embodiments of the present disclosure.

FIG. 4 is a flow diagram corresponding to a method 430 for digital switching activity sensing in accordance with some embodiments of the present disclosure. The method 430 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 430 is performed by one or more components of the system 100 of FIG. 1 and/or one or more components of the system 200 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 432, an operation to sum a quantity of open clock gates associated with a plurality of latches can be performed by circuitry (e.g., by first circuitry). In some embodiments, the plurality of latches can be grouped into multiple subsets of latches among the plurality of latches that are each associated with a particular open clock gate. As described above, the latches can be edge-triggered latches, level-sensitive latches, or flip-flops. The open clock gates can be analogous to the clock gates 104-1 to 104-N described in connection with FIG. 1 and/or the clock gates 204-1 to 204-N described in connection with FIG. 2, herein. The latches that are grouped into multiple subsets of latches can be analogous to the groups of latches 106-1 to 106-N described in connection with FIG. 1 and/or the groups of latches 206-1 to 206-N described in connection with FIG. 2, herein. The circuitry can be analogous to the adder circuit 108 of FIG. 1 and/or at least one of the adder circuits 208-1 to 208-M and/or the adder circuit 214 of FIG. 2.

At operation 434, an activity indication is generated based on a result of the operation to sum the quantity of open clock gates associated with the plurality of latches described in connection with operation 432. The activity indication can be analogous to the activity indication 110/210/310 described in connection with FIG. 1, FIG. 2, and FIG. 3, herein. Accordingly, in some embodiments, the method 430 can include performing the operation to sum the quantity of open clock gates associated with the plurality of latches by performing an operation to sum a quantity of open fine grain clock gates associated with the plurality of latches.

In some embodiments, the method 430 can further include determining an average quantity of open clock gates for subsets of latches among the plurality of latches and performing the operation to sum the quantity of open clock gates associated with the plurality of latches (e.g., associated with each of the subsets of latches) by summing the average quantity of open clock gates for each of the multiple subsets of latches. That is, as described above, embodiments of the present disclosure allow for a weight to be assigned to one or more fine grain clock gates based on a quantity of latches (e.g., edge-triggered latches, level-sensitive latches, etc.) or flip-flops associated with each of the fine grain clock gates. This can allow for instantaneous (or near-instantaneous) current sensing to track, limit, adjust, and/or manipulate power consumption and/or noise dynamically in a system or circuit, such as an ASIC, to reduce an amount of power consumed by such systems or circuits.

In some embodiments, the weight assigned to the fine grain clock gates based on the quantity of latches (e.g., edge-triggered latches, level-sensitive latches, etc.) and/or flip-flops associated with each of the fine grain clock gates can be scaled, at least for subset of groups of the latches or flip-flops. Accordingly, the method 430 can further include applying a scale factor to a quantity of open clock gates associated with at least one of the multiple subsets of latches among the plurality of latches, as described in connection with FIG. 2, herein.

At operation 436, the activity indication is transferred to second circuitry (e.g., power management circuitry) as part of performing a power management operation. The power management circuitry can be analogous to the power management circuitry 318 described in connection with FIG. 3, herein. In some embodiments, the circuitry of the method 430 can comprise a first adder circuit, a second adder circuit, and/or a third adder circuit, as illustrated in FIG. 1 and/or FIG. 2, herein. However, in at least one embodiment, operation 434 and operation 436 (e.g., the generating operation and the transferring operation) are performed by the second adder circuit or the third adder circuit. For example, in at least one embodiment, operation 434 and operation 436 are performed by the adder circuit 214 discussed in connection with FIG. 2, herein, although embodiments are not so limited.

Figure 5:
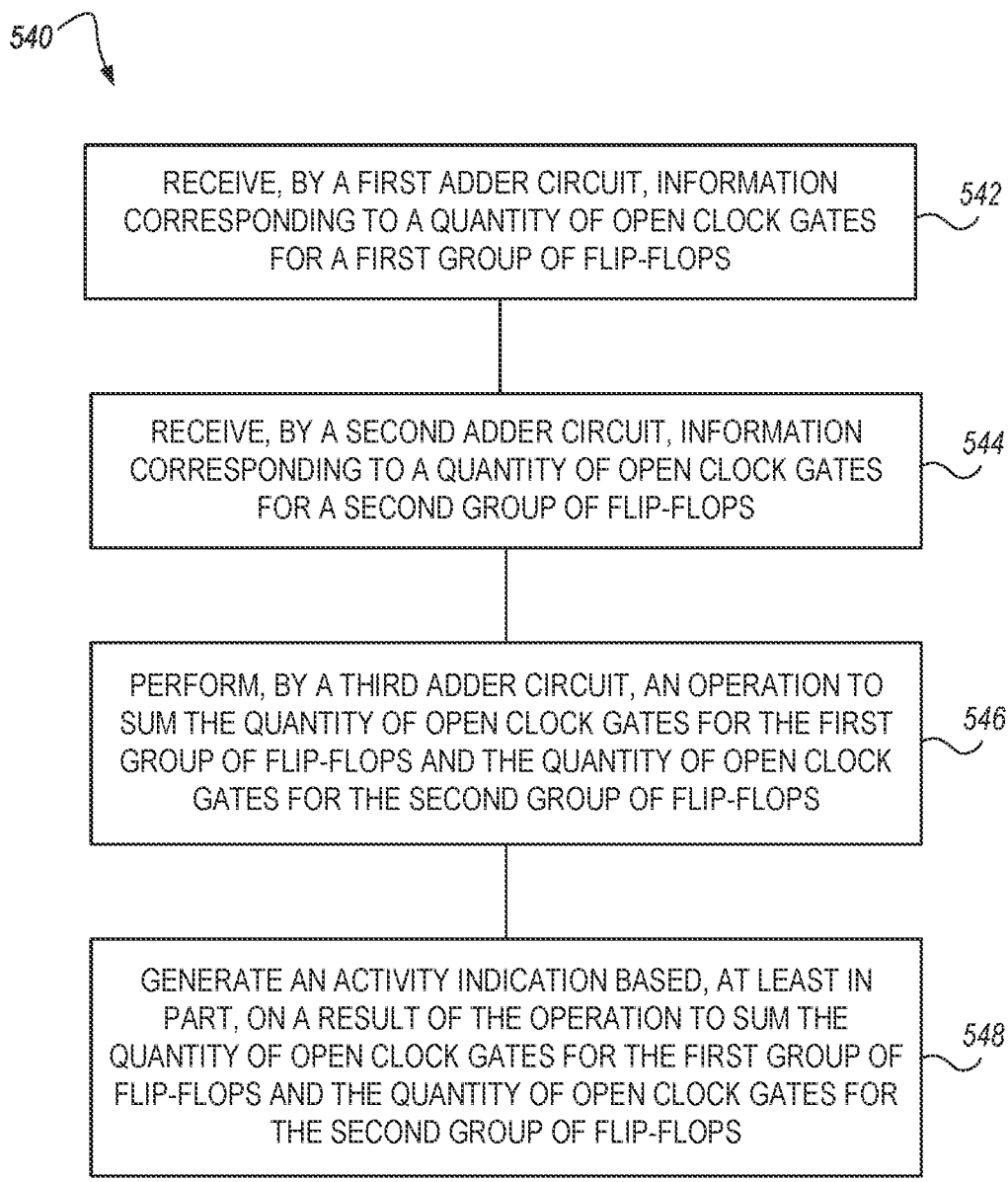
FIG. 5 is another flow diagram corresponding to a method for digital switching activity sensing in accordance with some embodiments of the present disclosure.

FIG. 5 is a flow diagram corresponding to a method 540 for digital switching activity sensing in accordance with some embodiments of the present disclosure. The method 540 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 540 is performed by one or more components of the system 100 of FIG. 1 and/or one or more components of the system 200 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 542, a first adder circuit receives information corresponding to a quantity of open clock gates for a first group of flip-flops. In some embodiments, there can be a single open clock gate associated with the first group of latches, while in other embodiments there can be multiple open clock gates associated with the first group of latches. The first adder circuit can be analogous to the adder circuit 208-1 illustrated in FIG. 2, herein. As described above, the clock gates can be analogous to the clock gates 104-1 to 104-N described in connection with FIG. 1 and/or the clock gates 204-1 to 204-N described in connection with FIG. 2, herein. In the illustrative example of FIG. 5, the first group of flip-flops is analogous to the groups of flip-flops 206-2 and 206-N illustrated in FIG. 2, herein.

At operation 544, a second adder circuit receives information corresponding to a quantity of open clock gates for a second group of flip-flops. In some embodiments, there can be a single open clock gate associated with the second group of latches, while in other embodiments there can be multiple open clock gates associated with the second group of latches. The second adder circuit can be analogous to the adder circuit 208-M illustrated in FIG. 2, herein. In the illustrative example of FIG. 5, the second group of flip-flops is analogous to the groups of flip-flops 206-1 and 206-3 illustrated in FIG. 2, herein.

In some embodiments, the method 540 includes performing, by the first adder circuit, an operation to sum the quantity of open clock gates for the first group of flip-flops and performing, by the second adder circuit, an operation to sum the quantity of open clock gates for the second group of flip-flops. That is, in some embodiments, the first adder circuit and/or the second adder circuit can perform operations to calculate a quantity of open clock gates for the first group of flip-flops and the second group of flip-flops.

The method 540 can include receiving the information corresponding to the quantity of open clock gates for the first group of flip-flops and the information corresponding to the quantity of open clock gates for the first group of flip-flops concurrently. Embodiments are not so limited, however, and in some embodiments the method 540 can include receiving the information corresponding to the quantity of open clock gates for the first group of flip-flops and the information corresponding to the quantity of open clock gates for the second group of flip-flops periodically based on a quantity of clock cycles that have elapsed since previous receipt of the information corresponding to the quantity of open clock gates for the first group of flip-flops and the information corresponding to the quantity of open clock gates for the second group of flip-flops.

At operation 546, a third adder circuit performs an operation to sum the quantity of open clock gates for the first group of flip-flops and the quantity of open clock gates for the second group of flip-flops. In the illustrative example of FIG. 5, the third adder circuit is analogous to the adder circuit 214 illustrated in FIG. 2, herein.

In some embodiments, the method 540 includes applying, prior to performing the operation to sum the quantity of open clock gates for the first group of flip-flops and the quantity of open clock gates for the second group of flip-flops, a scale factor to a result of the operation to sum the quantity of open clock gates for the first group of flip-flops or the quantity of open clock gates for the second group of flip-flops. The scale factor can be applied using the scale factor circuitry 212 illustrated in FIG. 2, herein. In some embodiments, the method 540 includes applying the scale factor to the result of the operation to sum the quantity of open clock gates for the first group of flip-flops or the quantity of open clock gates for the second group of flip-flops that has a greater quantity of flip-flops associated therewith.

At operation 548, an activity indication is generated based, at least in part, on a result of the operation to sum the quantity of open clock gates for the first group of flip-flops and the quantity of open clock gates for the second group of flip-flops. The activity indication can be analogous to the activity indication 110/210/310 described in connection with FIG. 1, FIG. 2, and FIG. 3, herein. Accordingly, the activity indication can be used in performance of a power management operation. In some embodiments, the method 540 includes transferring the activity indicator to power management circuitry coupled to the third adder circuit as part of performance of a power management operation (e.g., an operation to regulate or otherwise manage voltage, current, and/or noise in the systems described herein). The power management circuitry can be analogous to the power management circuitry 318 described in connection with FIG. 3, herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method for digital switching activity sensing, comprising:
    performing, by first circuitry, an operation to sum a quantity of enable signals corresponding to open clock gates associated with a subset of a plurality of latches;
    generating an activity indication based on a result of the operation to sum the quantity of enable signals corresponding to open clock gates associated with the plurality of latches; and
    transferring the activity indication to second circuitry as part of performing a power management operation.

2. The method of claim 1, wherein the latches among the plurality of latches comprise edge-triggered latches or level-sensitive latches.

3. The method of claim 1, further comprising:
    determining an average quantity of open clock gates for subsets of latches among the plurality of latches; and
    performing the operation to sum the quantity of open clock gates associated with the plurality of latches by summing the average quantity of open clock gates for the subsets of latches among the plurality of latches.

4. The method of claim 1, wherein the method comprises performing, via a first adder circuit, the operation to sum the quantity of open clock gates associated with the plurality of latches; and wherein the generating and transferring are performed via a second adder circuit.

5. The method of claim 1, further comprising applying a scale factor to a quantity of enable signals corresponding to open clock gates associated with at least one subset of latches among the plurality of latches.

6. A method, comprising:
    receiving, by a first adder circuit, a first amount of information corresponding to a first quantity of clock gates for a first group of a plurality of groups of flip-flops, wherein the first amount of information corresponding to the first quantity of clock gates is determined based on monitoring enable signals provided to the first quantity of clock gates, and wherein the first amount of information indicates how many of the first quantity of clock gates are enabled;
    receiving, by a second adder circuit, a second amount of information corresponding to a second quantity of clock gates for a second group of the plurality of groups of flip-flops, wherein the second amount of information corresponding to the second quantity of clock gates is based on monitoring enable signals provided to the second quantity of clock gates, and wherein the second information indicates how many of the second quantity of clock gates are enabled;
    performing, by a third adder circuit, an operation to sum the first amount of information and the second amount of information; and
    generating an activity indication based, at least in part, on a result of the operation to sum the first amount of information and the second amount of information, wherein the activity indication is used in the control of a power management operation.

7. The method of claim 6, further comprising applying, prior to performing the operation to sum the quantity of open clock gates for the first group of flip-flops and the quantity of open clock gates for the second group of flip-flops, a scale factor to a result of the operation to sum the quantity of open clock gates for the first group of flip-flops or the quantity of open clock gates for the second group of flip-flops.

8. The method of claim 7, further comprising applying the scale factor to the result of the operation to sum the quantity of open clock gates for the first group of flip-flops or the quantity of open clock gates for the second group of flip-flops that has a greater quantity of flip-flops associated therewith.

9. The method of claim 6, further comprising transferring the activity indication to power management circuitry coupled to the third adder circuit as part of performance of the power management operation.

10. The method of claim 6, further comprising:
    performing, by the first adder circuit, an operation to sum the quantity of open clock gates for the first group of flip-flops; and
    performing, by the second adder circuit, an operation to sum the quantity of open clock gates for the second group of flip-flops.

11. The method of claim 6, further comprising receiving the information corresponding to the quantity of open clock gates for the first group of flip-flops and the information corresponding to the quantity of open clock gates for the second group of flip-flops concurrently.

12. The method of claim 6, further comprising receiving the information corresponding to the quantity of open clock gates for the first group of flip-flops and the information corresponding to the quantity of open clock gates for the second group of flip-flops periodically based on a quantity of clock cycles that have elapsed since previous receipt of the information corresponding to the quantity of open clock gates for the first group of flip-flops and the information corresponding to the quantity of open clock gates for the second group of flip-flops.

13. An apparatus, comprising:
    first circuitry configured to:
        perform an operation to sum a quantity of information relating to open clock gates associated with a plurality of latches that are grouped into multiple groups of latches;
        wherein the first amount of information corresponding to the first quantity of clock gates is determined based on monitoring enable signals provided to the first quantity of clock gates, and wherein the first amount of information indicates how many of the first quantity of clock gates are enabled,
        generate an activity indication based, at least in part, on a result of the operation to sum the quantity of information relating to open clock gates; and
        transfer the activity indication to second circuitry as part of performance of a power management operation, wherein the latches comprise edge-triggered latches or level-sensitive latches.

14. The apparatus of claim 13, wherein the first circuitry comprises one or more adder circuits.

15. The apparatus of claim 13, further comprising third circuitry, wherein the third circuitry is configured to apply a scale factor to the result of the operation to sum the quantity of open clock gates associated with the plurality of edge-triggered latches or level-sensitive latches.

16. The apparatus of claim 13, wherein the first circuitry comprises:
   a first adder circuit to perform an operation to sum a quantity of open clock gates associated with a first group of the latches;
   a second adder circuit to perform an operation to sum a quantity of open clock gates associated with a second group of the latches; and
   a third adder circuit to perform an operation to sum the quantity of open clock gates associated with the first group of the latches and the quantity of open clock gates associated with the second group of the edge-triggered latches or level-sensitive latches.

17. An apparatus, comprising:
   a first group of flip-flops coupled to a first adder circuit;
   a second group of flip-flops coupled to a second adder circuit; and
   a third adder circuit coupled to the first adder circuit and the second adder circuit, wherein:
      the first adder circuit is configured to:
         receive information corresponding to a quantity of open clock gates associated with the first group of flip-flops;
            wherein the information corresponding to the first quantity of clock gates is determined based on monitoring enable signals provided to the first quantity of clock gates, and wherein the first amount of information indicates how many of the first quantity of clock gates are enabled; and
         perform an operation to sum the quantity of open clock gates associated with the first group of flip-flops,
      the second adder circuit is configured to:
         receive information corresponding to a quantity of open clock gates associated with the second group of flip-flops;
            wherein the information corresponding to the second quantity of open clock gates is based on monitoring enable signals provided to the second quantity of open clock gates, and wherein the second information indicates how many of the second quantity of clock gates are enabled; and
         perform an operation to sum the quantity of open clock gates associated with the second group of flip-flops, and
      the third adder circuit is configured to:
         receive a result of the operation to sum the quantity of open clock gates associated with the first group of flip-flops;
         receive a result of the operation to sum the quantity of open clock gates associated with the second group of flip-flops;
         perform an operation to sum the information associated with the first quantity of open clock gates and the information associated with the second quantity of open clock gates; and
         generate an activity indication based, at least in part, on the result of the operation to sum the quantity of information related to the first quantity of open clock gates and the information associated with the second quantity of open clock, wherein the activity indication is used in control of a power management operation.

18. The apparatus of claim 17, wherein the operations performed by the first adder circuit, the second adder circuit, and the third adder circuit are performed as part of the power management operation.

19. The apparatus of claim 17, further comprising power management circuitry coupled to at least the third adder circuit, wherein the power management circuitry is configured to:
   receive the activity indication; and
   take an action to control an amount of voltage, and amount of current, or both, generated by the power management circuitry based on the activity indication.

20. The apparatus of claim 17, further comprising scale factor circuitry, wherein the scale factor circuitry is configured to apply a scale factor to a result of the operation to sum the quantity of open clock gates associated with the first group of flip-flops or a result of the operation to sum the quantity of open clock gates associated with the second group of flip-flops, or both.

21. The apparatus of claim 20, wherein the scale factor circuitry is further configured to apply the scale factor to the result of the operation to sum the quantity of open clock gates associated with the first group of flip-flops or the result of the operation to sum the quantity of open clock gates associated with the second group of flip-flops based on which of the first group of flip-flops and the second group of flip-flops contains a greater quantity of flip-flops.

22. The apparatus of claim 17, wherein the first adder circuit and the second adder circuit are configured to receive the information corresponding to the quantity of open clock gates associated with the first group of flip-flops and the information corresponding to the quantity of open clock gates associated with the second group of flip-flops concurrently.

23. The apparatus of claim 17, wherein the first adder circuit and the second adder circuit are configured to receive the information corresponding to the quantity of open clock gates associated with the first group of flip-flops and the information corresponding to the quantity of open clock gates associated with the second group of flip-flops periodically based on a quantity of clock cycles that have elapsed since previous receipt of the information corresponding to the quantity of open clock gates for the first group of flip-flops and the information corresponding to the quantity of open clock gates for the second group of flip-flops.

* * * * *